(12) United States Patent
Oaki et al.

(10) Patent No.: US 7,787,686 B2
(45) Date of Patent: Aug. 31, 2010

(54) IMAGE DENSITY-ADAPTED AUTOMATIC MODE SWITCHABLE PATTERN CORRECTION SCHEME FOR WORKPIECE INSPECTION

(75) Inventors: Junji Oaki, Kanagawa (JP); Shinji Sugihara, Tokyo (JP)

(73) Assignee: Advanced Mask Inspection Technology, Kawasaki-shi (JP)

( * ) Notice: Subject to any disclaimer, the term of this patent is extended or adjusted under 35 U.S.C. 154(b) by 0 days.

(21) Appl. No.: 12/482,836

(22) Filed: Jun. 11, 2009

(65) Prior Publication Data

US 2009/0245619 A1 Oct. 1, 2009

Related U.S. Application Data

(62) Division of application No. 11/360,679, filed on Feb. 24, 2006, now Pat. No. 7,565,032.

(30) Foreign Application Priority Data

Sep. 22, 2005 (JP) ............................. 2005-276586

(51) Int. Cl.
*G06K 9/00* (2006.01)
(52) U.S. Cl. ...................... 382/141; 382/144; 382/145
(58) Field of Classification Search ................. 345/613, 345/694; 382/141, 144, 145, 146, 147, 148, 382/149, 151, 152, 299, 300
See application file for complete search history.

(56) References Cited

U.S. PATENT DOCUMENTS

2003/0090681 A1 * 5/2003 Jones et al. ................. 356/614
2004/0052409 A1   3/2004 Bansal et al.
2005/0243921 A1  11/2005 Au et al.

FOREIGN PATENT DOCUMENTS

| JP | 08-076359 | 3/1996 |
|----|-----------|--------|
| JP | 10-096613 | 4/1998 |
| JP | 2000-105832 | 4/2000 |
| JP | 2000-241136 | 9/2000 |
| JP | 2006-030518 | 2/2006 |

* cited by examiner

*Primary Examiner*—Matthew C Bella
*Assistant Examiner*—Gregory F Cunningham
(74) *Attorney, Agent, or Firm*—Oblon, Spivak, McClelland, Maier & Neustadt, L.L.P.

(57) ABSTRACT

An image correction device for use in a pattern inspection apparatus is disclosed, which has automatic adaptability to variations in density of a pattern image of a workpiece being tested. The device is operable to identify a two-dimensional (2D) linear predictive model parameters from the pattern image of interest and determine the value of a total sum of these identified parameters. This value is then used to switch between a corrected pattern image due to the 2D linear prediction modeling and a corrected image that is interpolated by bicubic interpolation techniques. A pattern inspection method using the image correction technique is also disclosed.

3 Claims, 14 Drawing Sheets

(LARGE OFFSET OF PARAMETER SUM FROM 1.0)

↑
(LOW-DENSITY PATTERN GENERATED)

↑ (DEFECT NOT DETECTABLE)

↑ (DEFECT DETECTABLE)

(REPLACE)

(CROP)

IMAGE DENSITY-ADAPTED AUTOMATIC MODE SWITCHABLE PATTERN CORRECTION SCHEME FOR WORKPIECE INSPECTION

CROSS-REFERENCE TO RELATED APPLICATION

This application is a divisional of U.S. application Ser. No. 11/360,679, filed Feb. 24, 2006 and claims priority of Japanese Patent Application No. 2005-276586, filed on Sep. 22, 2005, the disclosure of each of which is incorporated herein by reference.

BACKGROUND OF THE INVENTION

1. Field of the Invention

The present invention relates generally to image correction technologies and, more particularly, to a method and apparatus for inspecting pattern images for defects, including ultrafine circuit patterns of reticles for use in the manufacture of large-scale integrated (LSI) semiconductor devices and/or low-profile flat panel display devices, such as liquid crystal display (LCD) panels.

2. Description of the Related Art

Related Art

Usually, LSI chip fabrication comes with cost penalties, so it is inevitable to improve production yields. One of yield reduction factors must be the presence of pattern defects of a reticle used for photolithographically transferring or "imaging" an ultrafine circuit pattern onto semiconductor wafers. In recent years, as LSI chips decrease in feature sizes, pattern defects to be detected decrease in minimum size. This in turn requires a further increase in accuracy of a pattern inspection apparatus for inspecting a reticle for defects.

Currently established pattern defect inspection methodology is generically classified into two approaches, one of which employs die-to-die (DD) comparison techniques, and the other of which uses due-to-database (DB) comparison schemes. The DD comparison is a method for detecting defects through comparison between those images of two square regions or "dies" on a reticle while regarding one of them as an inspection reference pattern image and letting the other be a pattern image under testing. The DB comparison is a method of detecting defects by comparing the sensor data of a die to design data as created from computer-aided design (CAD) data for the LSI design use.

With the quest for further miniaturization of on-reticle circuit patterns, a need is felt to attain the ability to detect extra-fine defects, which are small enough to be buried in a positional offset between picture elements or "pixels" of to-be-compared images, image expansion/shrink, swell, and sensing noises. In the DD or DB comparison also, it becomes very important to accurately perform alignment and image correction in units of sub-pixels, which are typically done prior to the pattern inspection by comparison of the reference pattern image and under-test pattern image.

A known approach to meeting this need is to employ a pre-finishing process prior to execution of the "main" inspection by comparison of a couple of images—i.e., the inspection reference pattern image and the test pattern image. This process includes the steps of performing bicubic interpolation-based alignment in units of subpixels and thereafter sequentially performing image expansion/shrink correction, image swell correction, resize correction, noise averaging processing and others. An example of the image expand/shrink correction is disclosed in JP-A-2000-241136. Unfortunately, mere repeated execution of these corrections would result in occurrence of accumulated errors, which can cause appreciable image degradation or "corruption." Another problem faced with the prior art lies in difficulties in setting appropriate values for a great number of parameters required for respective corrections and also in setup of an adequate execution order of such correction processes.

BRIEF SUMMARY OF THE INVENTION

It is therefore an object of this invention to provide a technique for accurately correcting or "amending" the image of a workpiece under inspection.

Alternative object of the invention is to provide an approach to accurately inspecting the image of a workpiece being tested.

A currently preferred form of the invention is the one that integrally combines together alignment and image correction techniques. Its one principal feature lies in effective image correction using input/output predictive modeling which is less in image degradation or "corruption" and also less in number of setup parameters. This image correction is typically for realizing the alignment and the image correction in units of subordinate pixels or "sub-pixels" by using a two-dimensional (2D) input/output predictive modeling scheme while letting an inspection reference pattern image be used as input data and also letting an under-test pattern image be output data, by way of example. In this case, the image data is used to create a relational expression of a matrix; then, solve a set of simultaneous equations to thereby identify more than one model parameter. Next, based on the identified 2D linear predictive model, a correction image is created.

In this case, regarding pattern images with extra-low densities, a mere approach to identifying 2D linear predictive models can sometimes encounter the failure to establish any intended accuracy of model parameters due to deficiency of the amount of information within a matrix of rows and columns. Adversely, in the case of such ultralow-density pattern images, image correction methods relying upon only the per-subpixel alignment based on the above-noted bicubic interpolation is deemed preferable in some events.

It is therefore an object of this invention to provide an effective image correction technique with enhanced adaptability to variations in density of a pattern image being tested while automatically switching between a 2D linear prediction modeling-based correction method and a bicubic interpolation-based method when performing image correction in a pattern inspection apparatus, such as a reticle inspection apparatus or equipment.

In accordance with one aspect of this invention, an image correction device is provided, which is for correcting a pattern image by use of an inspection reference pattern image of a workpiece being tested and a pattern image under test. This device includes an equation generation unit operative to generate by linear predictive modeling a set of simultaneous equations for the reference pattern image and the under-test pattern image, a parameter generation unit which is operable to solve the equations to thereby obtain model parameters, and a parameter sum calculation unit for obtaining a total sum of model parameters. The device also includes a sub-pixel interpolation computing unit for performing interpolation against the reference pattern image and the test pattern image to thereby generate a subpixel interpolated image, a subpixel shift amount generation unit which uses the subpixel interpolated image to obtain a subpixel shift amount for minimization of a deviation error in position between the reference pattern image and the test pattern image, and an error comparison unit which compares the parameter sum and a threshold. The device further includes a corrected pattern image generation unit which uses the model parameter to generate a corrected pattern image based on the linear predictive modeling, an interpolated image correction unit for generating an interpolated corrected image based on interpolation processing.

In accordance with another aspect of the invention, a pattern inspection apparatus for performing pattern inspection by using an inspection reference pattern image of a workpiece being tested and a pattern image under testing is provided. The inspection apparatus includes the image correction device stated above and a pattern image comparison unit which compares the test pattern image to any one of the corrected pattern image and the interpolated corrected image.

In accordance with a further aspect of the invention, an image correction method is provided for correcting a pattern image by use of an inspection reference pattern image of a workpiece being tested and a pattern image under test. The method includes the steps of generating by linear predictive modeling a set of simultaneous equations for the reference pattern image and the under-test pattern image, solving the equations to thereby obtain model parameters, obtaining a total sum of model parameters, performing interpolation against the reference pattern image and the test pattern image to thereby generate a sub-pixel interpolated image, using the sub-pixel interpolated image to obtain a sub-pixel shift amount for minimization of a deviation error in position between the reference pattern image and the test pattern image, and comparing the parameter sum and a threshold to find an error therebetween, if any. If the parameter sum is within the threshold, then use the model parameter to generate a corrected pattern image based on the linear predictive modeling. If the parameter sum is out of the threshold then generate an interpolated corrected image based on interpolation processing.

In accordance with another further aspect of the invention, a workpiece pattern inspection method employing the image correction method is provided. Pattern inspection is done by comparing the test pattern image to any one of the corrected pattern image and the interpolated corrected image.

DETAILED DESCRIPTION OF THE INVENTION

An image correction technique and a pattern inspection procedure in accordance with currently preferred embodiments of this invention will now be explained with reference to the accompanying drawings below.

(Image Correction Device)

An image correction device embodying the invention is for correction or "amendment" of a pattern image as drawn on a workpiece being tested. The image corrector device uses an inspection reference pattern image of a workpiece under test and a sensed pattern image of the under-test workpiece to generate a correction pattern image. This pattern image is a corrected or "amended" version of the inspection reference pattern image or the test pattern image. Although the description below assumes that the test workpiece is a reticle for example, the workpiece may alternatively be any other pattern image-formed objects for use in the manufacture of semiconductor devices or LCD panels, including but not limited to photomasks and wafers. The reference pattern image and the test pattern image are the ones that are compared together. In case there are two pattern images to be compared, no differences occur if the reference pattern image and the test pattern image are named vice versa. The reference pattern image and test pattern image are for use as objects to be compared by the DD or DB comparison scheme.

(Pattern Inspection Apparatus)

A pattern inspection apparatus embodying the invention is the one that inspects for defects a pattern image as drawn on a workpiece being tested. This inspection apparatus includes the image correction device, for comparing a pattern image under test to a corrected pattern image as generated at the image corrector device to thereby inspect the pattern image for defects. For instance, the inspection apparatus is equipped with an illumination unit which emits illumination light onto a workpiece under testing, an image acquisition unit for detecting reflected light or transmission light from the under-test workpiece to thereby acquire a pattern image thereof, a reference data generator circuit for generating from CAD data design data resembling the graphics data of a reticle, and a comparison processing unit for comparing between the pattern images.

Figure 3:
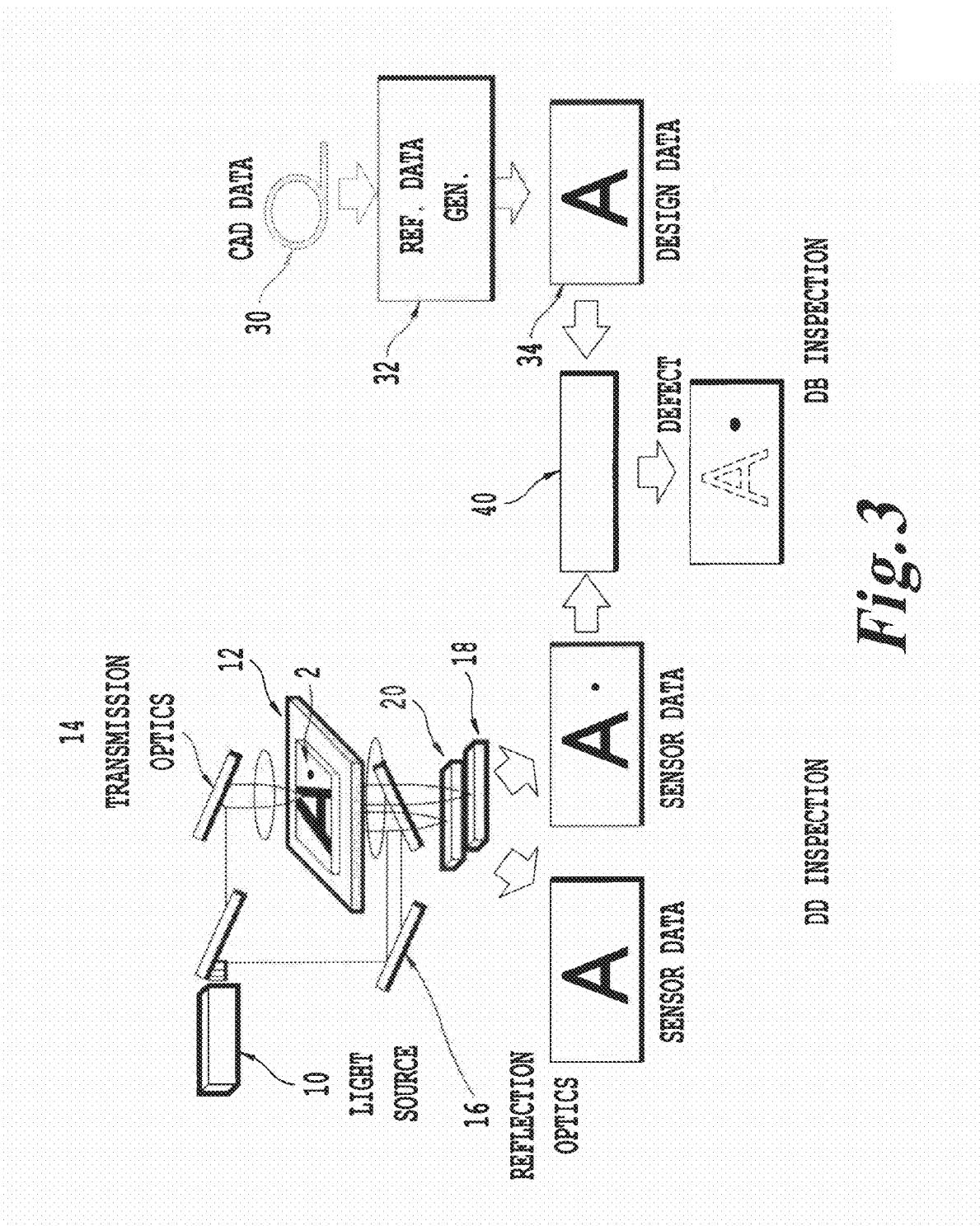
FIG. 3 is a diagram showing an exemplary configuration of a pattern inspection apparatus embodying the invention.

See FIG. 3, which shows an exemplary arrangement of the pattern inspection apparatus. The illumination unit of this inspection apparatus includes a light source 10 for producing and emitting coherent light. The image acquisition unit includes a stage structure 12 which stably supports a reticle 2 as mounted thereon, a stage driver (not shown) for driving the stage 2, a transmission light optical system 14 which guides the light from the light source 12 to pass through the reticle 2 mounted on stage 12, a reflected light optics 16 capable of detecting its reflection light, an optical sensor module 18 for detecting light components that have passed through the optics 14, and a reflected light sensor 20 for sensing the reflected light from the reflection light optics 16. With such an arrangement, the pattern inspection apparatus is operable to acquire the sensor data (i.e., optical image) of the pattern image drawn on the reticle. The transmission optics 14 and reflection optics 16 are each made up of a half mirror and a convex lens assembly, for example. The pattern inspection apparatus includes at least one of the transmission optics 14 and reflection optics 16. The inspection apparatus includes at least one of the transmission light sensor 18 and the reflected light sensor 20. The inspection apparatus also includes a reference data generation circuit 32 which creates design data (i.e., reference image) based on CAD data 30 for the LSI design use. The apparatus further includes a comparison processing unit 40. With this arrangement, the inspection apparatus is capable of detecting pattern defects, if any, by either comparing sensor data sets together or comparing a sensor data set to the design data.

Figure 4:
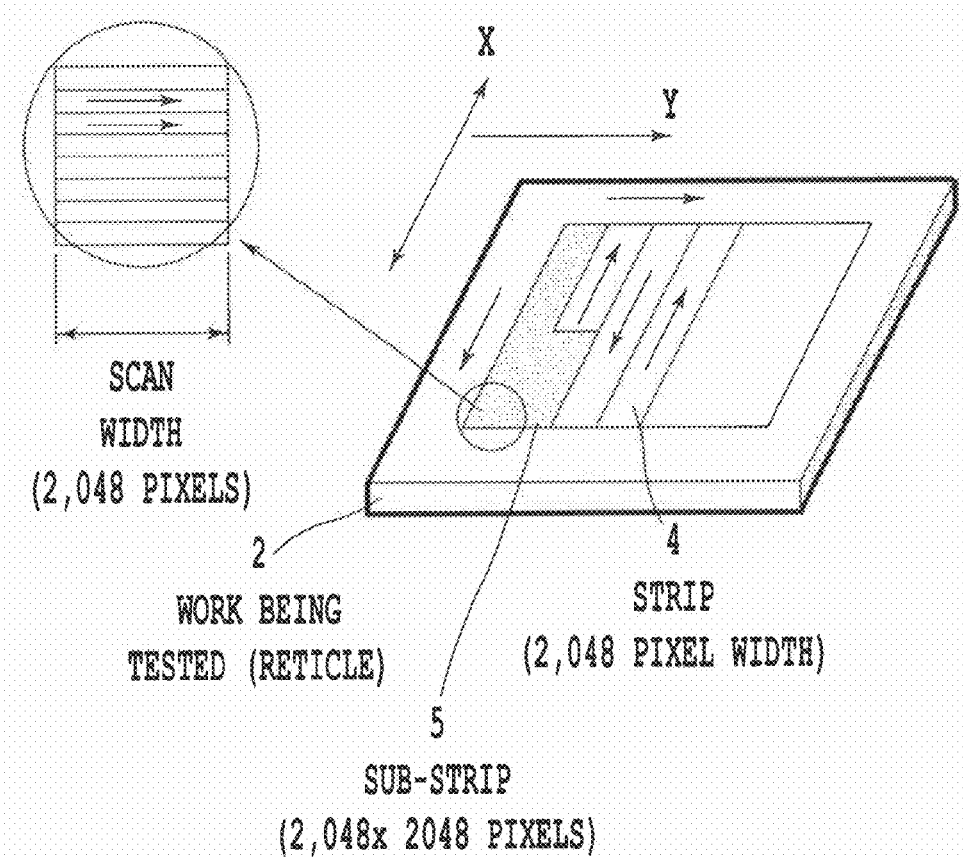
FIG. 4 is a diagram showing a perspective view of a reticle during scanning by a line sensor for obtaining a pattern image of the reticle.

A method of acquiring the pattern image drawn on the reticle 2 will be set forth with reference to FIG. 4. Firstly, let the reticle 2 be scanned by a line sensor having a linear array of photodiodes (PDs). Here, for purposes of convenience in description, a unitary narrow elongate portion 4 as cut out of the reticle surface area of interest in the X-axis direction (in a direction parallel to one side edge of reticle 2) will be called a one strip. This strip is further cut into fine square portions or "dies" in the Y-axis direction (in the direction perpendicular to the X-axis direction). A sensed image 5 of such die portion will be called one "sub-strip." The one sub-strip is arranged for example to have a matrix of 2,048 rows and 2,048 columns of picture elements or "pixels." The inspection that determines whether defects are present or absent is performed in units of substrips, by way of example. Additionally one pixel has 256 levels of grayscale.

The inspection apparatus performs a pattern inspection operation by comparing pattern images together as shown in FIG. 3. In the case of DD comparison, at least one of the transmission light or reflection light is used to store or "record" the resulting sensor data in either the sensor 18 or the sensor 20. Then, sensor data sets of two dies on the reticle 2 are compared together by the comparison processor unit 40 for detection of defects, if any. Alternatively in the case of the DB comparison, there are used the sensor data of one die on reticle 2 as recorded in the sensor 18 or 20 by using at least one of the transmission light and reflected light and the design data 34 created by the reference data generator circuit 32 based on the LSI design-use CAD data 30. Next in the DB comparison, the sensor data and design data 34 are compared together by the comparison processor 40 to thereby defect defects. Note here that the pattern inspection apparatus may be configured from electronic circuitry, software programs, personal computer (PC), or any possible combinations thereof.

(Comparator Processor)

Figure 1A:
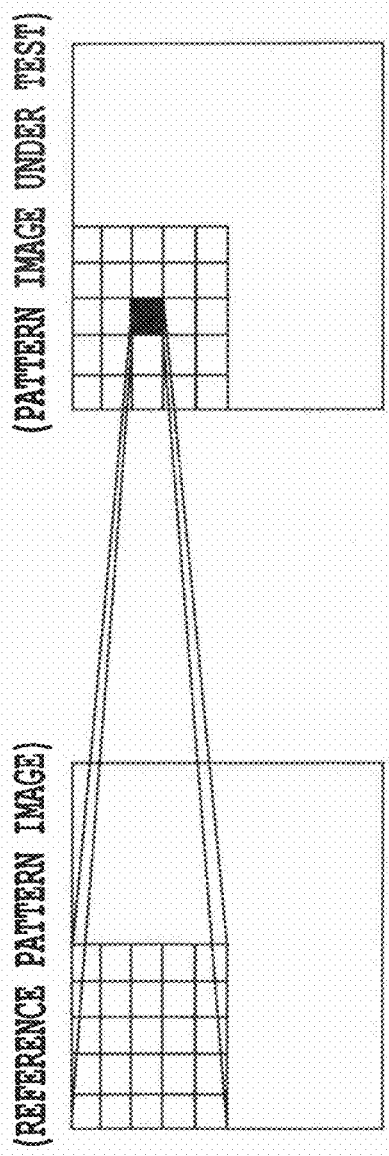
FIGS. 1A and 1B are diagrams showing a pattern image being tested and an inspection reference pattern image for explanation of a two-dimensional (2D) predictive modeling scheme for use in a pattern image inspection method embodying the invention.
Figure 1B:
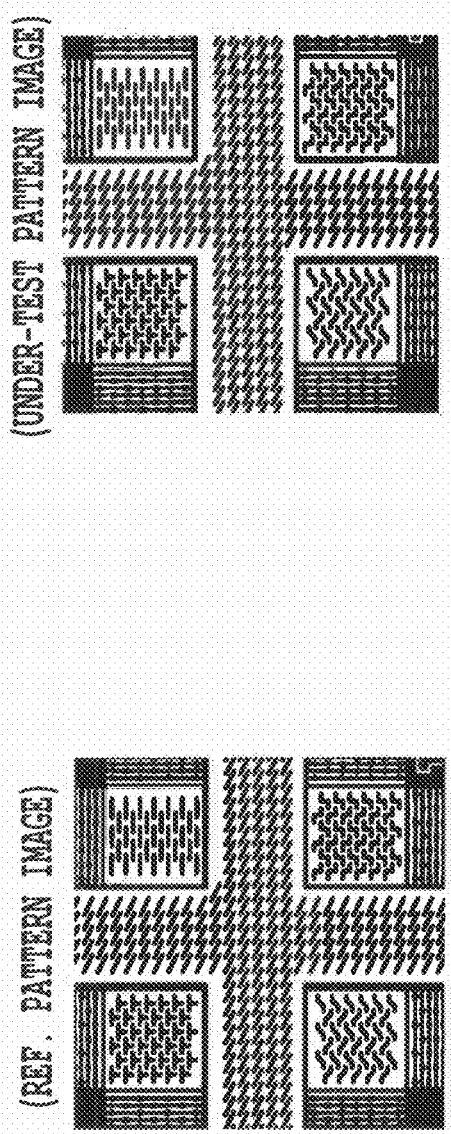
Figure 2:
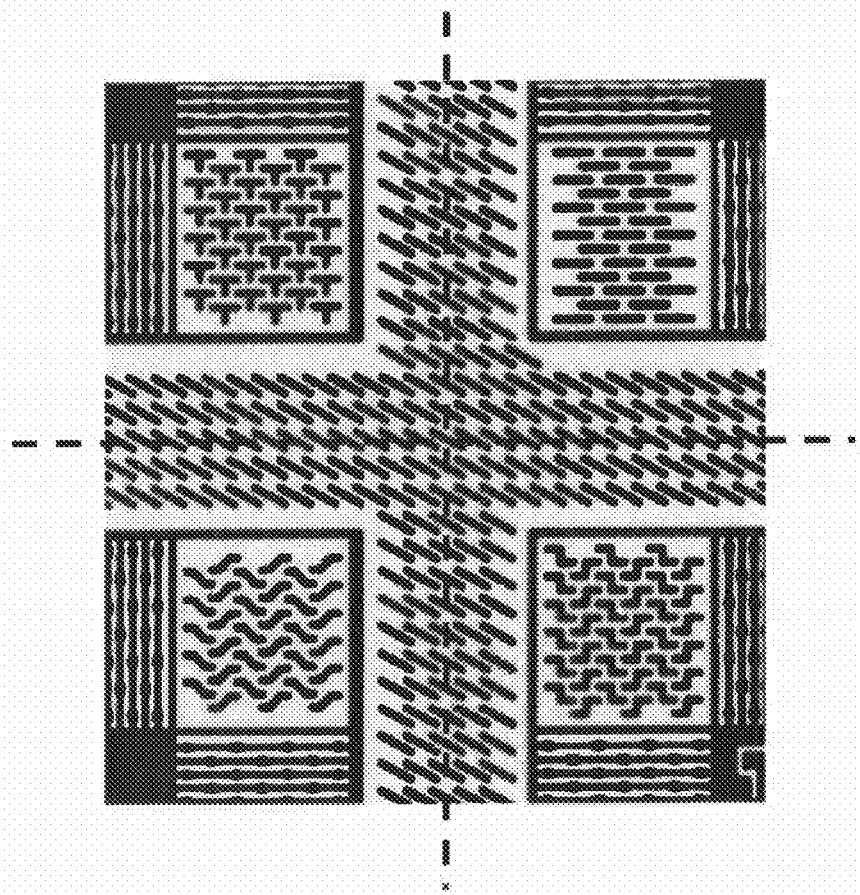
FIG. 2 is a diagram showing a pattern as subdivided into several portions.
Figure 5:
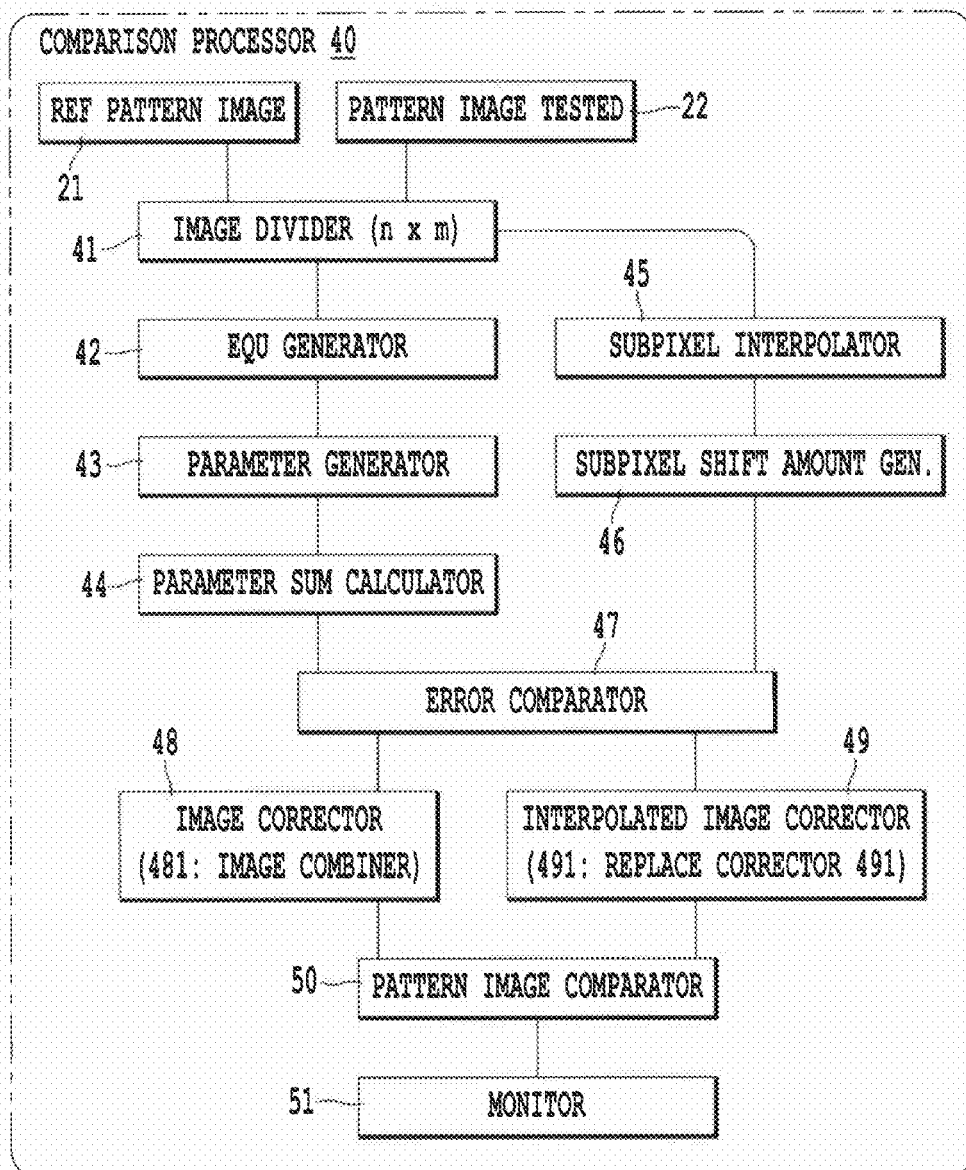
FIG. 5 illustrates in block diagram form a configuration of a comparison processing unit in the pattern inspection apparatus of FIG. 3.

A configuration of the comparison processing unit 40 is shown in FIG. 5. The comparison processor unit 40 is for comparing together an inspection reference pattern image 21 and a pattern image 22 under testing. Comparison processor 40 is generally made up of an image n×m subdivision unit 41, equation generation unit 42, parameter generation unit 43, parameter sum calculation unit 44, sub-pixel interpolation processing unit 45, subpixel shift amount generation unit 46, parameter sum/threshold error comparison unit 47, corrected pattern image correction unit 48, image synthesis unit 481, subpixel-interpolated image correction unit 49, replacement correction unit 491, pattern image comparison unit 50, and record history monitor unit 51. The image divider unit 41 is operable to subdivide an image into a matrix of n rows and m columns of segments (where n and m are integers). More specifically, divider 41 divides in advance a respective one of the inspection reference pattern image 21 and under-test pattern image 22 into a plurality of rectangular regions or "dies" and then sets up two-dimensional (2D) linear predictive models in respective die regions to thereby identify parameters in a way independent of one another. In the example of FIGS. 1A-1B, the division number n and m are each set to one (1). In the example of FIG. 2, n=m=2. In addition, the image divider 41 has subtraction functionality and is thus capable of reducing the division number in decremental steps; for example, reduce it to (n−1)×m or n×(m−1), and then to (n−1)×(m−1), et seq.

The equation generator unit 42 is for generating by linear predictive modeling a set of simultaneous equations for the inspection reference pattern image 21 and under-test pattern image 22. The parameter generator 43 solves the simultaneous equations to thereby obtain model parameters $b_{00}$ to $b_{44}$. The parameter sum calculator 44 operates to obtain a sum of the model parameters $b_{00}$-$b_{44}$ thus identified. In cases where this model parameter sum is appreciably deviated in value from 1.0, this means that the model parameter identification is not performed accurately.

The subpixel interpolation processor unit 45 may be a known one that performs interpolation processing in units of subpixels. The subpixel as used herein refers to a unit which is smaller than a single pixel, for example, a portion that is eight times less than one pixel. For example, the subpixel interpolation processor 45 presets a ⅛ pixel as a unitary shift amount and performs interpolation processing by known bicubic interpolation techniques in units of subpixels. The subpixel shift-amount generator unit 46 operates to search the shift amount.

The parameter sum/threshold error comparator 47 is operatively responsive to receipt of the parameter sum obtained at the parameter sum calculator 44, for comparing it to a predefined threshold value to thereby find an error therebetween, if any. If the parameter sum is within the threshold, it is determined that the image correction based on the 2D predictive modeling is proper. If the parameter sum is out of the threshold then determine the subpixel interpolation rather than the 2D predictive modeling is adequately applicable. Note that although the parameter sum as used in this embodiment is a total sum of parameters by a standard addition scheme as an example, other arithmetic processing schemes are alternatively employable as far as these substantially indicate the degree of eccentricity of a pattern image even when the numeric value is varied after having applied arithmetic processing, such as addition, subtraction, multiplication and division, to the parameter sum. Also note that while the threshold is variable in value in a way depending upon the way of obtaining the parameter sum, in case the parameter sum is obtained by addition, it indicates a range of numeric values; for example, let 0.95<Sp<1.05, where Sp is the parameter sum.

The corrected pattern image corrector unit 48 uses the model parameters to correct the pattern image, thereby creating a corrected pattern image. The image synthesis unit 481 combines together or "synthesizes" corrected pattern images obtained by subdivision to thereby generate a corrected pattern image of the entirety. This image combiner 481 is typically disposed within the corrected pattern image corrector 48, although it may be placed outside when the need arises. The subpixel-interpolated image corrector 49 may be a known electrical circuit operable to perform image shifting in units of subpixels by bicubic interpolation techniques to thereby correct the image. The replacement corrector 491 replaces an interpolation-corrected image corresponding to a divided corrected pattern image with the divided/corrected pattern image. This corrector 491 is usually disposed within the subpixel-interpolated image corrector 49, although it may be external thereto. The pattern image comparator 50 compares the under-test pattern image to either the corrected pattern image or the interpolation-corrected image to thereby perform pattern inspection. The record history monitor 51 is responsive to receipt of data obtained through measurement, such as model parameters, model parameter sum and subpixel shift amounts, for storing the data in a memory device once per measurement. Examining the record history of such stored measurement data enables detection of changes with time in the image correction device and pattern inspection apparatus. This makes it possible to monitor the pattern image's gain or else on a real-time basis, thereby finding its deviation in calibration, if any.

An example of the memory device for use in the comparator processor 40 is a semiconductor memory having several storage regions including, but not limited to, an n×m divided image storage region, equation storage region, parameter storage region, model parameter sum storage region, subpixel interpolation computation-use storage region, subpixel shift-amount storage region, parameter sum/threshold error comparison-use storage region, corrected pattern image correction-use storage region, subpixel-interpolated image correction-use storage region, and comparison result storage region. The comparator processor 40 reads the stored data out of the built-in memory and then applies thereto computation processing in accordance with a prespecified system routine of arithmetic processing device and next stores in respective storage regions solution methodology of the simultaneous equations and computation results, such as an image comparison result (not depicted). The image correction device is similar in configuration to the pattern inspection apparatus with the pattern image comparator unit 50 being excluded from the latter.

(Pattern Inspection Method)

Figure 6:
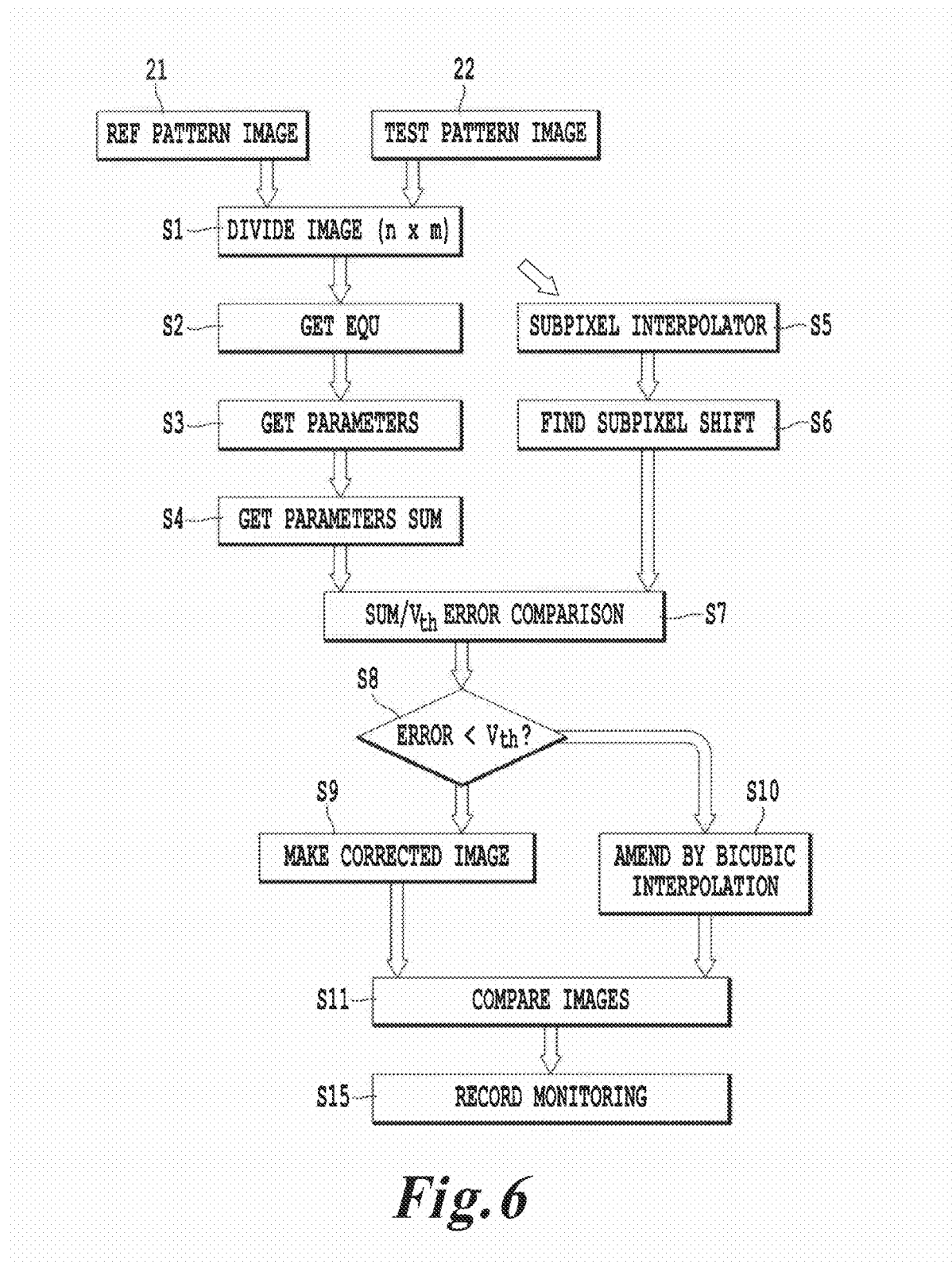
FIG. 6 is a flow diagram showing a procedure of pattern inspection.

See FIG. 6, which is a flow diagram showing a system procedure of a pattern inspection method embodying the invention. This method is to inspect a pattern image for defects by use of the corrected pattern image as obtained by the image correction method stated supra. The procedure starts with step S1, which receives an inspection reference pattern image 21 and pattern image 22 under testing and then subdivides, prior to the intended image comparison, each image into a plurality of portions—that is, a matrix of n×m "dies" having position coordinates unique thereto, which are stored in the divided image storage region of the memory along with the division ratio used. Then, the procedure goes to step S2, which generates by linear predictive modeling a set of simultaneous equations for the reference pattern image 21 and under-test pattern image 22, which equations are stored in the memory at its equation storage region. Then, proceed to step S3 which solves the simultaneous equations to obtain model parameters, which are stored in the memory at its parameter storage region.

The system routine goes next to step S4, which obtains a total sum of the identified model parameters $b_{00}$ to $b_{44}$ and stores the parameter sum in the parameter sum storage region of the memory. Then, go to step S5 which performs interpolation processing in units of subpixels in a known way to obtain subpixel interpolation results, which are then stored in the memory at its subpixel interpolation-use region. At step S6, search a subpixel shift amount and then stores the searched shift amount in the memory at its subpixel shift amount generation-use region. Then, proceed to step S7, which is responsive to receipt of the parameter sum as calculated at step S4, for comparing the sum to a predefined threshold to thereby define as an error a difference therebetween, if any. The comparison result is stored in the memory in its error comparison-use storage region.

At step S8, determine whether the parameter sum obtained at step S7 is within the threshold. If the sum is within the threshold, then proceed to step S9; if the sum is out of the threshold then go to step S10. At step S9, use the model parameters to correct or "amend" the pattern image, thereby creating a corrected pattern image, which is stored in the memory at its corrected pattern image storage region. At step S10, perform image shifting in units of subpixels by known bicubic interpolation techniques to thereby correct the image, followed by storing correction results in the memory at its subpixel-interpolated image correction-use storage region. Subsequently, the routine goes to step S11, which performs pattern inspection by comparing the under-test pattern image to either one of the corrected pattern image and the interpolation-corrected image and then stores pattern inspection results in the comparison result storage region of the memory.

With the procedure stated above, it is possible to perform pattern inspection successfully even for precise pattern image components of the workpiece being tested. At step S15 for record history monitoring, store measured data items, such as the model parameters, centroid positions of such parameters and subpixel shift amounts, once at a time whenever measurement is done. In this record monitoring step S15, examine the record history of the measured data to detect with-time variations of the image correction device and the pattern inspection apparatus. In this way, monitor or "watchdog" the gain or else of the under-test workpiece pattern image to detect its deviation in calibration, if any.

This pattern inspection method is realizable based on a software program to be installed in currently available digital computers for execution thereby. This program has the process steps of the pattern inspection method stated supra. Workpieces such as reticles are adequately pattern-inspectable for defects by any one of the hardware- or software-based approaches. Additionally, an image correction method is similar in arrangement to the above-stated pattern inspection method with the pattern image comparison step S11 being eliminated therefrom.

(Equation Generation Unit and Step)

Referring to FIGS. 1A-1B, examples of the inspection reference pattern image and under-test pattern image are shown for explanation of the linear predictive modeling by use of the relationship therebetween. The above-noted image correction device uses a linear predictive modeling technique to correct the pattern image of interest at the comparison processor unit 40. The image correction device is the one that breaks through the limit of direct comparison methods. More specifically, as shown in FIG. 1B, the relation between the reference pattern image and test pattern image is online identified during inspection by use of linear predictive modeling—e.g., two-dimensional (2D) linear predictive modeling—to thereby establish a prediction model, which absorbs (fitting) any possible pixel position variations, expansion/shrink noises and sensing noises of the images concerned. Based on this predictive model, the corrected pattern image is created. This corrected pattern image is then compared to the test pattern image. Using a comparison result, defects of the test pattern image are detectable.

An explanation will first be given of a method for setting the 2D linear prediction model (2D input/output linear predictive model) while assuming that the inspection reference pattern image is 2D input data whereas the under-test pattern image is 2D output data. Suppose here that the 2D linear predictive model uses an area having a matrix of five rows and five columns (5×5) of pixels, for example. Suffixes used in this model, which correspond to the positions of 5×5 pixels), are indicated in Table 1 below. Note that in FIGS. 1A-1B, the reference pattern image is shown at the left-side part while the under-test pattern image is at the right-side part. Additionally the 2D linear predictive model is a linear predictive model in case the input and output data items are handled two-dimensionally.

TABLE 1

|   | 0 | 1 | 2 | 3 | 4 |
|---|---|---|---|---|---|
| 0 | i−2, j−2 | i−2, j−1 | i−2, j | i−2, j+1 | i−2, j+2 |
| 1 | i−1, j−2 | i−1, j−1 | i−1, j | i−1, j+1 | i−1, j+2 |
| 2 | i, j−2 | i, j−1 | i, j | i, j+1 | i, j+2 |
| 3 | i+1, j−2 | i+1, j−1 | i+1, j | i+1, j+1 | i+1, j+2 |
| 4 | i+2, j−2 | i+2, j−1 | i+2, j | i+2, j+1 | i+2, j+2 |

Let the 2D input and 2D output data be $u(i,j)$, $y(i,j)$, respectively. While the suffixes of the pixel of interest are given as "i" and "j," determine a block of 5×5 pixels (i.e., a total of twenty five pixels) around this pixel which is centrally located in the block. Then, let the suffixes of these nearby pixels be set as shown in Table 1. Next, regarding pixel data of a certain set of 5×5 pixel area, set up a relational equation (1) presented below. Note that in this equation (1), coefficients $b_{00}$ to $b_{44}$ of each input data $u(i,j)$ are the model parameters to be identified.

$$y_k = y(i, j) \quad (1)$$
$$= b_{00}u(i-2, j-2) + b_{01}u(i-2, j-1) + b_{02}u(i-2, j) +$$
$$b_{03}u(i-2, j+1) + b_{04}u(i-2, j+2) + b_{10}u(i-1, j-2) +$$
$$b_{11}u(i-1, j-1) + b_{12}u(i-1, j) + b_{13}u(i-1, j+1) +$$
$$b_{14}u(i-1, j+2) b_{20}u(i, j-2) + b_{21}u(i, j-1) +$$
$$b_{22}u(i, j) + b_{23}u(i, j+1) + b_{24}u(i, j+2) + b_{30}u(i+1, j-2) +$$
$$b_{31}u(i+1, j-1) + b_{32}u(i+1, j) + b_{33}u(i+1, j+1) +$$
$$b_{34}u(i+1, j+2) + b_{40}u(i+2, j-2) + b_{41}u(i+2, j-1) +$$
$$b_{42}u(i+2, j) + b_{43}u(i+2, j+1) + b_{44}u(i+2, j+2) +$$
$$\varepsilon(i, j)$$

The meaning of Equation (1) is that the under-test pattern image's one pixel data $y_k=y(i,j)$ is representable by the linear coupling of data items of 5×5 pixels around its corresponding pixel in the inspection reference pattern image (see FIG. 1A). Note here that the residual difference $\varepsilon$ in Equation (1) is not evident in its statistical nature, and a parameter identification result obtained by a minimum squaring method to be later described will possibly have a bias. However, this rarely causes any serious deterrent in practical implementation. This can be said because the heart of this embodiment lies in the input/output data fitting using Equation (1) per se, and thus the parameter value of the residual difference $\varepsilon$ is out of direct use.

(Solving Simultaneous Equations)

The simultaneous equations are solved by the parameter Gen. 43 shown in FIG. 5 at step S3 of FIG. 6. A method of solving the equations is as follows. When vectorially representing Equation (1), Equation (2) is obtained. Here, an unknown parameter vector $\alpha$ is given as $\alpha=[b_{00}, b_{01}, \ldots, b_{44}]^T$, and data vector $x_k$ is represented by $x_k=[u(i-2,j-2), u(i-2,j-1), \ldots, u(i+2,j+2)]^T$.

$$x_k^T \alpha = y_k \quad (2)$$

The model parameter identification is achievable in a way which follows: scan the coordinates i, j of the inspection reference pattern image and under-test pattern image to acquire data of pixels at the coordinates (i,j); then, combine together 25 sets of data into an equation system. Practically, from a statistical viewpoint, prepare n (n>25) sets of data as in Equation (3). Then, solve twenty five-dimensional set of equations based on the minimum squaring method as will be set forth later, thereby identifying the value of $\alpha$. Here, $A=[x_1, x_2, \ldots, x_n]^T$, $y=[y_1, y_2, \ldots, y_n]^T$, and $x_k^T \alpha = y_k$, where $k=1, 2, \ldots, n$ (n is an integer). These equations are solvable by the minimum squaring method or any other available methods, such as a maximum likelihood estimation method.

$$\begin{bmatrix} x_1^T \\ \vdots \\ x_n^T \end{bmatrix} \alpha = \begin{bmatrix} y_1 \\ \vdots \\ y_n \end{bmatrix} \Rightarrow A\alpha = y \Rightarrow \alpha = (A^T A)^{-1} A^T y \quad (3)$$

Assume that the inspection reference pattern image and the under-test pattern image are each a block of 512×512 pixels as an example. In this case, scanning the model of a 5×5 pixel region results in a decrease of two pixels at every side edge of the image of interest. Thus, the resultant equation number is given by Equation (4), which suggests that 258,064 sets of data are obtainable. This number is deemed sufficient in a statistical viewpoint.

$$n=(512-4)\times(512-4)=258064 \quad (4)$$

(Parameter Sum Calculation Unit and Step)

Figure 7:
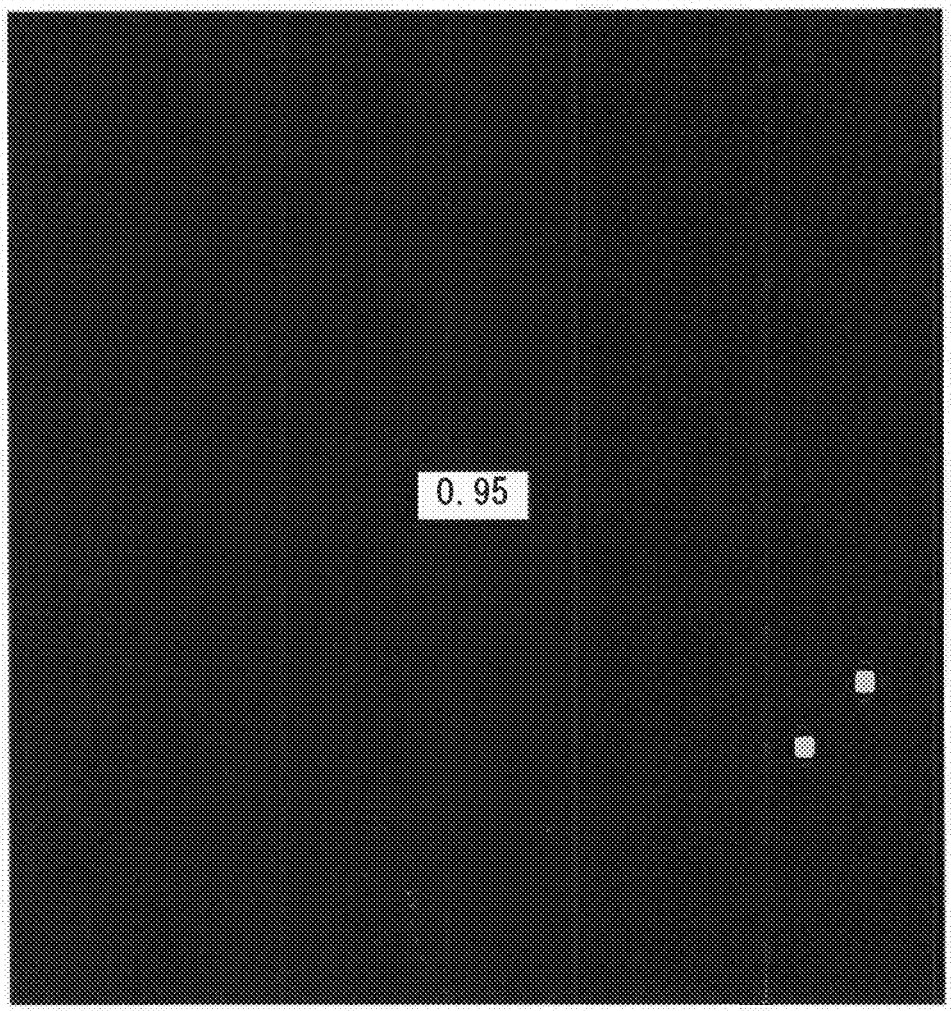
FIG. 7 is a pictorial representation of a low-density pattern image with its parameter sum being deviated from the ideal value "1.0."

A process for parameter calculation is to calculate a shift amount at each subpixel. In this parameter sum calculation, a total sum of the identified model parameters $b_{00}$ to $b_{44}$ must be "1.0" ideally. In case this parameter sum value is significantly deviated or offset from the value "1.0," this means that the parameter identification fails to be done with high accuracy required. Consider an exemplary pattern image shown in FIG. 7. This image has very few pattern components at its lower right part in a wide "dark" background area. As for such extra-low density image, an attempt to perform 2D linear predictive model identification can often end with a failure to establish the required model parameter accuracy, because the amount of matrix information is deficient due to the largeness of the dark area. At this time, the parameter sum identified has a value which is deviated or "diverged" from the ideal value "1.0"—here, 0.95.

Utilizing this nature of the identified parameter sum, apply it to a mechanism for automatically switching between the 2D predictive modeling-based correction and prior known bicubic interpolation-based correction. In addition, by examining the record history of the identified parameter sum, it is possible to monitor or "watchdog" whether the gain or else of an under-test workpiece pattern image deviates in calibration due to with-time changes of the image correction device and the pattern inspection apparatus.

(Corrected Pattern Image Generation Unit on 2D Linear Predictive Modeling and Step)

The parameter α thus identified and the input/output image data used for the identification are then substituted into Equation (1). Then, perform simulation processing for scanning the pixel coordinates i, j to thereby generate a corrected pattern image. This image is such that the minimum square method-based fitting results in decreases in pixel position deviation of less than one pixel, expansion/shrink, swell noises, resizing processing and sensing noises. Although the data used for such simulation can contain therein defective pixels in most cases, these hardly appear in the corrected pattern image. This can be said because such defective pixels are extremely less in number than the entire data used for the identification so that these are no longer subject to the fitting in the minimum squaring method. Additionally the signal-to-noise (S/N) ratio is improved in the surrounding area, so defective pixels are emphasized. This is an additional advantage unique to the embodiment.

(Pixel Dividing Unit (n×m) and Step)

Although in the above description a single 2D linear predictive model is set up for each pair of inspection reference pattern image and under-test pattern image, a respective pattern image may be divided in advance into a predetermined number of, e.g., four, portions as shown in FIG. 2, for setting 2D predictive models in these divided regions respectively and then identifying parameters in a way independent of one another. With this image division scheme, it is possible to obtain a corrected pattern image with robustness against increased intra-image variations and fluctuations.

(Subpixel Interpolation Processing Unit and Step)

The subpixel interpolation is principally for creation of a subpixel-interpolated image based on bicubic interpolation. See again FIG. 7, which shows the extra-low density pattern image having few dot-like elements only at a lower right corner of the "dark" blank area. This results in its parameter sum having a value of 0.95. Even when an attempt is made to identify a 2D linear predictive model for such centroid-decent pattern image, any sufficient model parameter accuracy is hardly expectable because of the deficiency of a matrix information amount due to the largeness of the dark area. Conversely, in the case of ultralow density images, good results are obtainable by using known methodology—e.g., image correction methods with only per-subpixel alignment based on bicubic interpolation. In this case, the subdivision of each pattern image is neither performed.

First set up a unitary shift amount of subpixel for use during bicubic interpolation. For example, set a ⅛ pixel as the unit shift amount. Then, use a bicubic interpolation method such as shown by Equations (5) and (6) below. Here, let a shift amount per ⅛ pixel in the x direction be represented by "u" while letting a per-⅛ pixel shift amount in the y direction be given as "v." Let a pixel of reference pattern image be "$z_i$."

Then, perform image correction by means of linear coupling. The computation for such correction is achievable by sequentially applying one-dimensional (1D) filters in the x and y directions to pixels $z_i$ of the reference pattern image.

$$z'_i = \frac{1}{2}u^2(u-1)z_{i+2} + \frac{1}{2}u(1+4u-3u^2)z_{i+1} + \\ \frac{1}{2}(u-1)(3u^2-2u-2)z_i - \frac{1}{2}u(u-1)^2 z_{i-1} \tag{5}$$

$$z''_j = \frac{1}{2}v^2(v-1)z'_{j+2} + \frac{1}{2}v(1+4v-3v^2)z'_{j+1} + \\ \frac{1}{2}(v-1)(3v^2-2v-2)z'_j - \frac{1}{2}v(v-1)^2 z'_{j-1} \tag{6}$$

While Equations (5)-(6) above assume that filter coefficients are calculated once at a time whenever the need arises, it is also permissible to calculate in advance those filter coefficients corresponding to the different shift amounts u and v on the basis of the unit shift amount, which are stored in the memory in a table format. This makes it possible to execute this filter computation at high speeds.

After having completed the preparation above, per-subpixel alignment is applied to the reference pattern image and under-test pattern image based on the square-distance minimum norm. First, execute bicubic interpolation of the reference pattern image using Equations (5) and (6). Then, overlap or "superimpose" it with the under-test pattern image. Next, while shifting it in units of ⅛ pixels, search for a specific shift amount which minimizes an evaluation function as represented by the square sum of level differences at respective pixels. This evaluation equation is freely selectable, so the process is not exclusively limited to the square. By using subpixel shift amounts u, v thus obtained by this search, generate an image by Equations (5) and (6). This image is the one that was obtained by an image correction method relying upon only the bicubic interpolation-based per-subpixel alignment. In this case, only positional deviations are correctable, so it is permissible to further added thereto expansion/shrink correction and/or swell correction when the need arises. These corrections are prior known and are to be used in accordance with the accuracy required. A detailed explanation thereof will be eliminated herein.

Example 1 of Automatic Correction Switch Method

A first exemplary method for automatically switching between the 2D linear predictive modeling correction and bicubic interpolation-based correction will be described. See FIG. 6, which shows a procedure of the automatic correction mode-switching method. In the case of 2D linear predictive modeling correction, the procedure starts with step S1, which subdivides each of the inspection reference pattern image and under-test pattern image into a matrix of n rows and n columns (n×n matrix) of small square regions or "dies." If n=1 then the result is "no division." Although image division into n×m strip-like regions is also employable, the following explanation deals with the case of n×n division for purposes of convenience in discussion herein. Note here that no image division is performed in the case of the bicubic interpolation-based correction. The procedure then goes to step S2 which generates simultaneous equations for the n×n sets of 2D linear predictive models. Then, go to step S3 which solves the n×n sets of simultaneous equations to thereby define model parameters. At step S4, calculate a parameter sum from the n×n sets of parameters identified. Next in step S5, perform interpolation in units of subpixels based on the bicubic interpolation. At step S6, search a specific position having the minimum positional offset while at the same time shifting the image in uniform movements each equal to a subpixel length, thereby obtaining a shift amount at that time. Then, go to step S7, which is responsive to receipt of a preset threshold along with the n×n parameter sum as obtained at step S4 and the shift amount obtained at step S6, for finding a difference between the parameter sum and the shift amount. If such difference or "error" is found then proceed to step S8, which compares it to the threshold to determine whether the n×n differences fall within the threshold. If YES at step S8, then go to step S9 which creates a corrected pattern image based on the 2D linear predictive modeling. In the case of division into multiple portions, respective corrected pattern images are combined or "synthesized" together to thereby create an entire corrected pattern image at step S9. Alternatively, if NO at step S8, that is, if at least one of the n×n differences is out of the threshold, then go to step S10, which generates a corrected pattern image with bicubic interpolation applied thereto. At the next step S11, compare the under-test pattern image to either the 2D linear predictive model-based corrected pattern image or the bicubic interpolation-based corrected pattern image, thereby performing pattern inspection.

Example 2 of Auto-Correction Switch Method

Figure 8A:
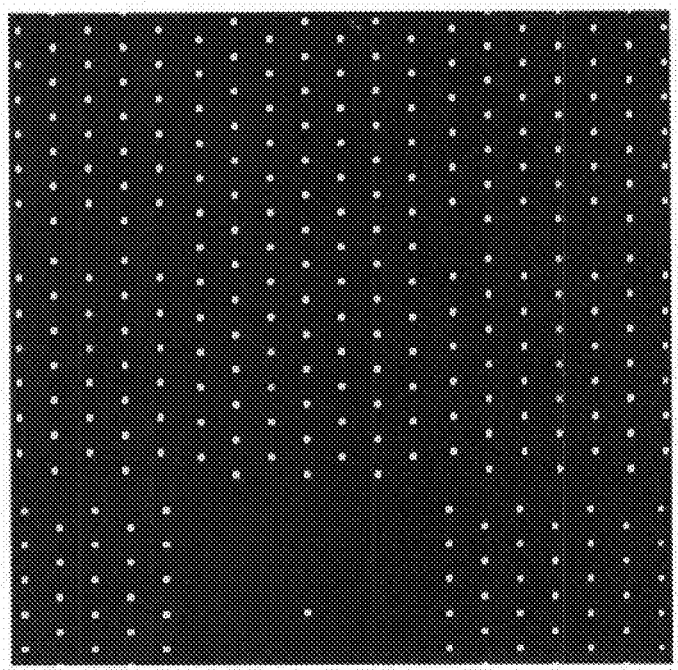
FIG. 8A shows a pattern image which is partly low in density.
Figure 8B:
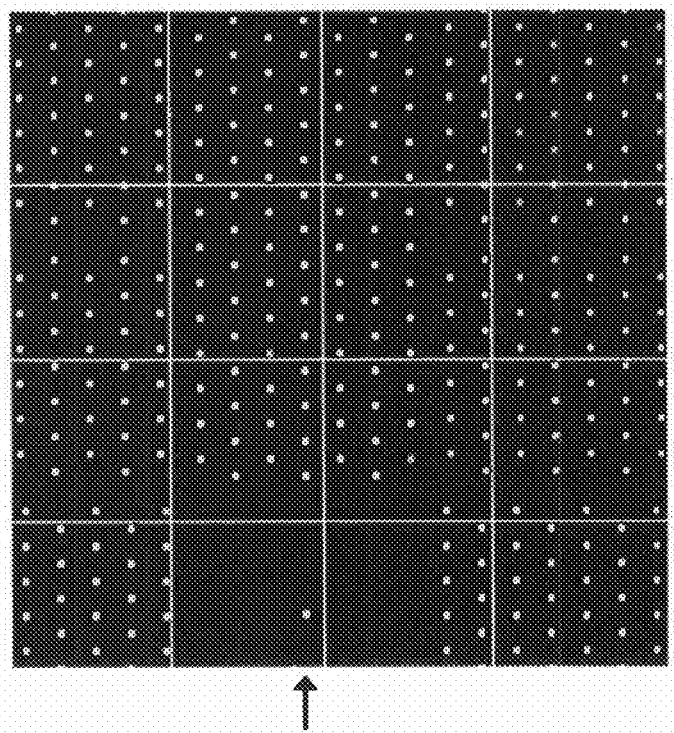
FIG. 8B shows a pattern image as divided into four rows and four columns of segments, with an extra-low image density region occurring therein.
Figure 9A:
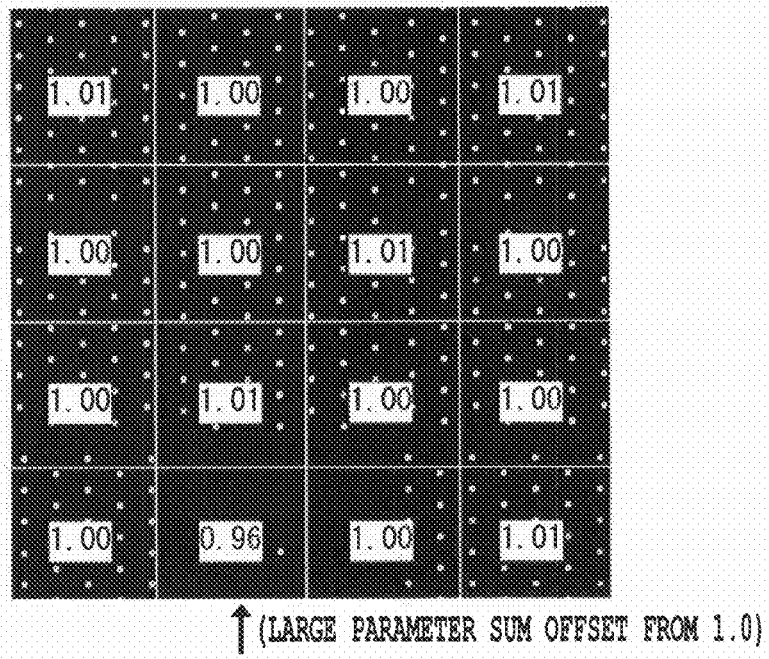
FIGS. 9A-9B are diagrams each showing a pattern image as divided into 4×4 matrix regions, one of which has its identified parameter sum that is largely diverged from the value 1.0, for explanation of with-time variability of the parameters identified.
Figure 9B:
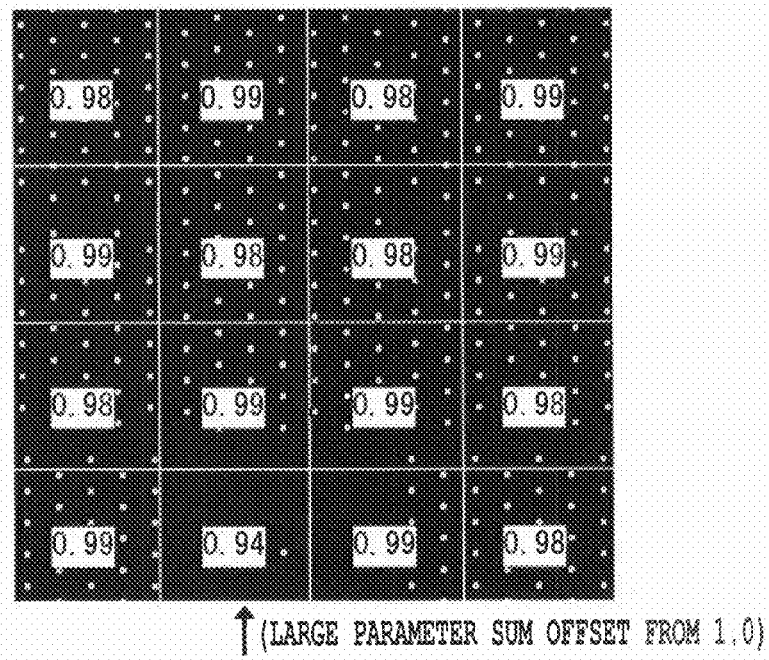
Figure 10:
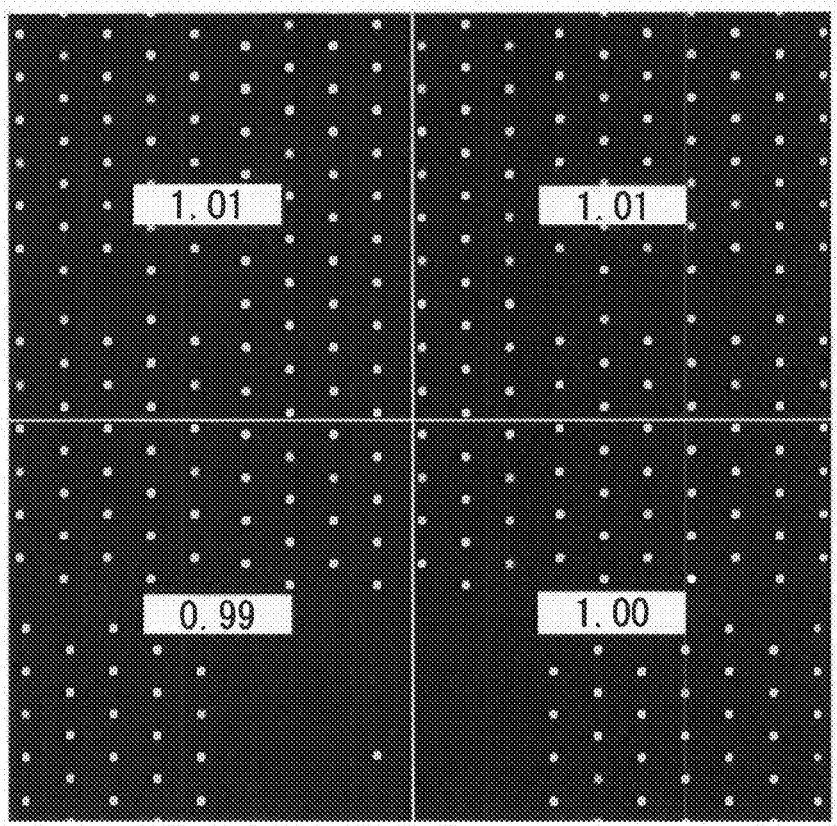
FIG. 10 shows a pattern image which corresponds to that of FIG. 9A or 9B and which is divided in this case into 2×2 regions, any one of which has its identified parameter sum in proximity to "1.0."

A second exemplary method for automatically switching between the 2D linear predictive modeling correction and the bicubic interpolation-based correction is shown in FIG. 11 in flowchart form. This method stated here includes a process for automatically setting up the dividing number of 2D linear predictive models also. For example, in the case of a pattern image which locally has very few pattern components in its lower mid zone as shown in FIG. 8, when an attempt is made to simply divide such partly extra-low density pattern image into a matrix of 4×4 of portions, one of these divided regions becomes noticeably low in density as shown in FIG. 9A, resulting in the parameter sum being diverged from the ideal value "1.0." It is thus ascertained that this division number is improper for the 2D linear predictive modeling. Another example of the 4×4 matrix divided image varied with time is shown in FIG. 9B. On the contrary, when dividing the image into a matrix of 2×2 portions as shown in FIG. 10, the locally ultralow density region disappears with the parameter sum coming closer to the value 1.0, so it is affirmed that this approach is suitably adaptable for the 2D linear predictive modeling.

Figure 11A:
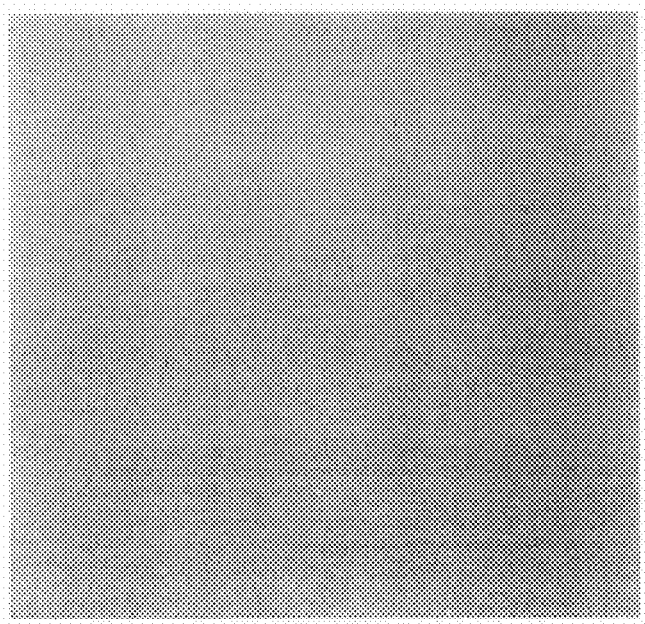
FIG. 11A shows a gray-scale pattern image with the lack of defect detectability.
Figure 11B:
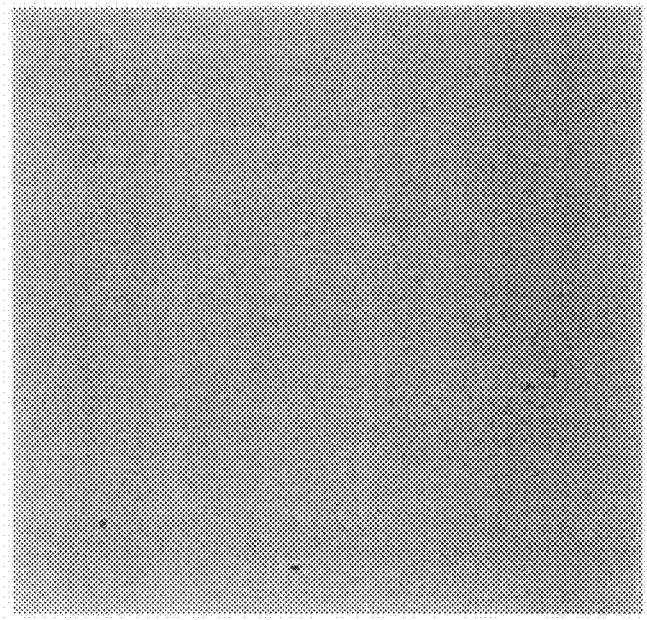
FIG. 11B shows a defect-detectable image.

In case the above-noted ultralow density region has a pixel defect, if a difference image is taken between the corrected pattern image shown in FIG. 9B and a pattern image under test, then such defect is no longer detectable since it is "invisible" in a gray-tone background as shown in FIG. 11A. However, when using the corrected pattern image of FIG. 10, it is possible to detect the pixel defect as shown in FIG. 11B. At lower part of FIG. 11B, the defect makes its appearance and thus observable distinctly.

Figure 12:
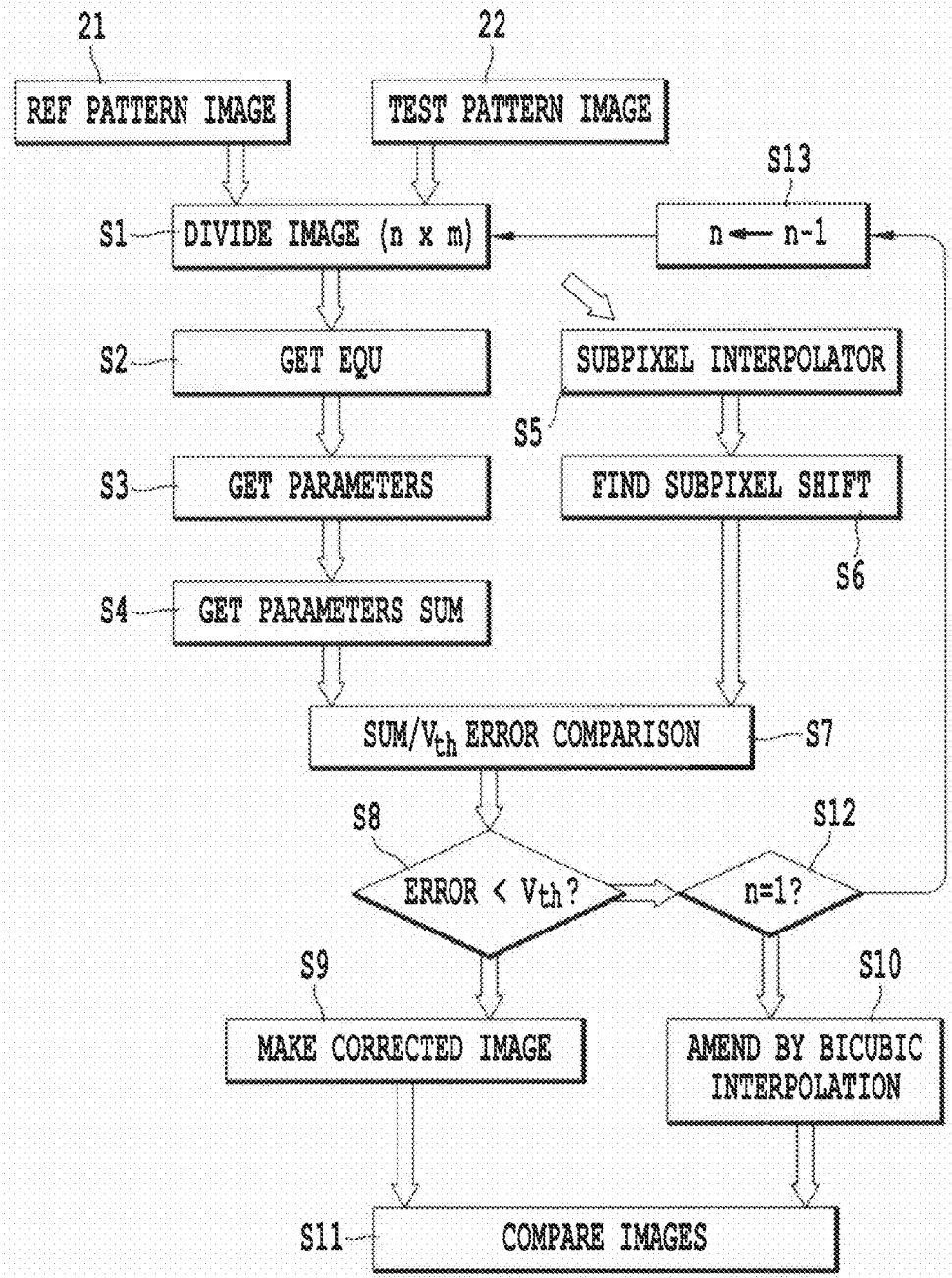
FIG. 12 is a flow chart showing a method for automatically switching between a 2D linear predictive modeling-based correction and a bicubic interpolation in accordance with an embodiment of the invention.

The procedure of FIG. 12 is similar to that of FIG. 6 except that process steps S12 and S13 of automatically reducing the image division number are added thereto. Step S13 is a decremental division step of reducing the division number. Even when the number is reduced to n=1 at step S12, the parameter sum can fail to reach the threshold. If this is the case, determine that the 2D linear predictive modeling is unsuitable. Thus, generate at step S10 an interpolation-corrected image based on the bicubic interpolation.

Example 3 of Auto-Correction Switch Method

Figure 13A:
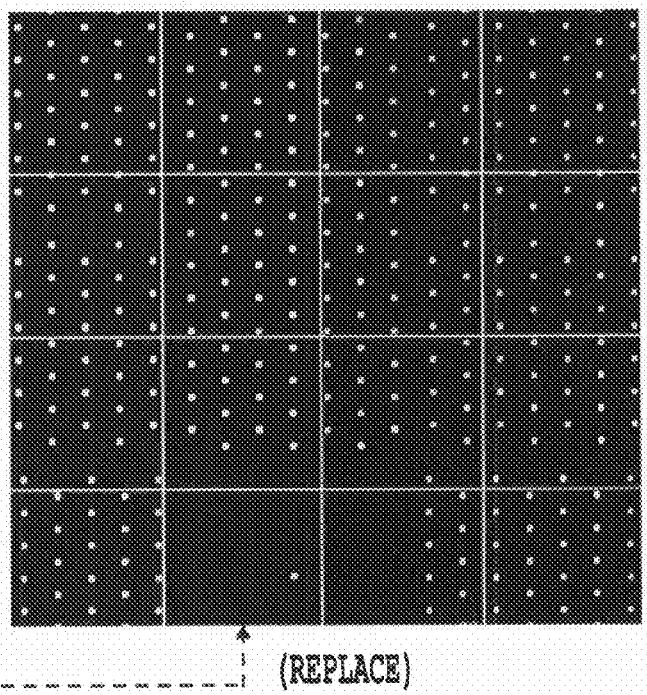
FIGS. 13A-13B are diagram for explanation of a technique for generating a corrected pattern image by partial image synthesis.
Figure 13B:
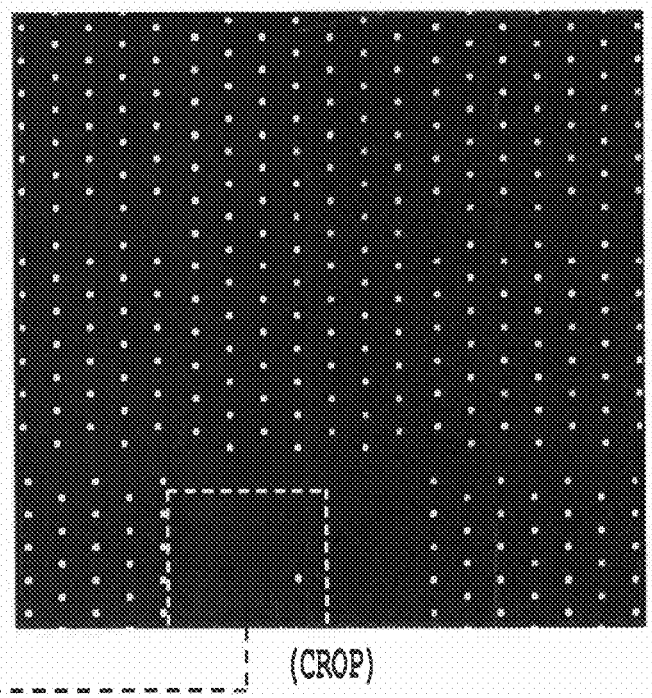
Figure 14:
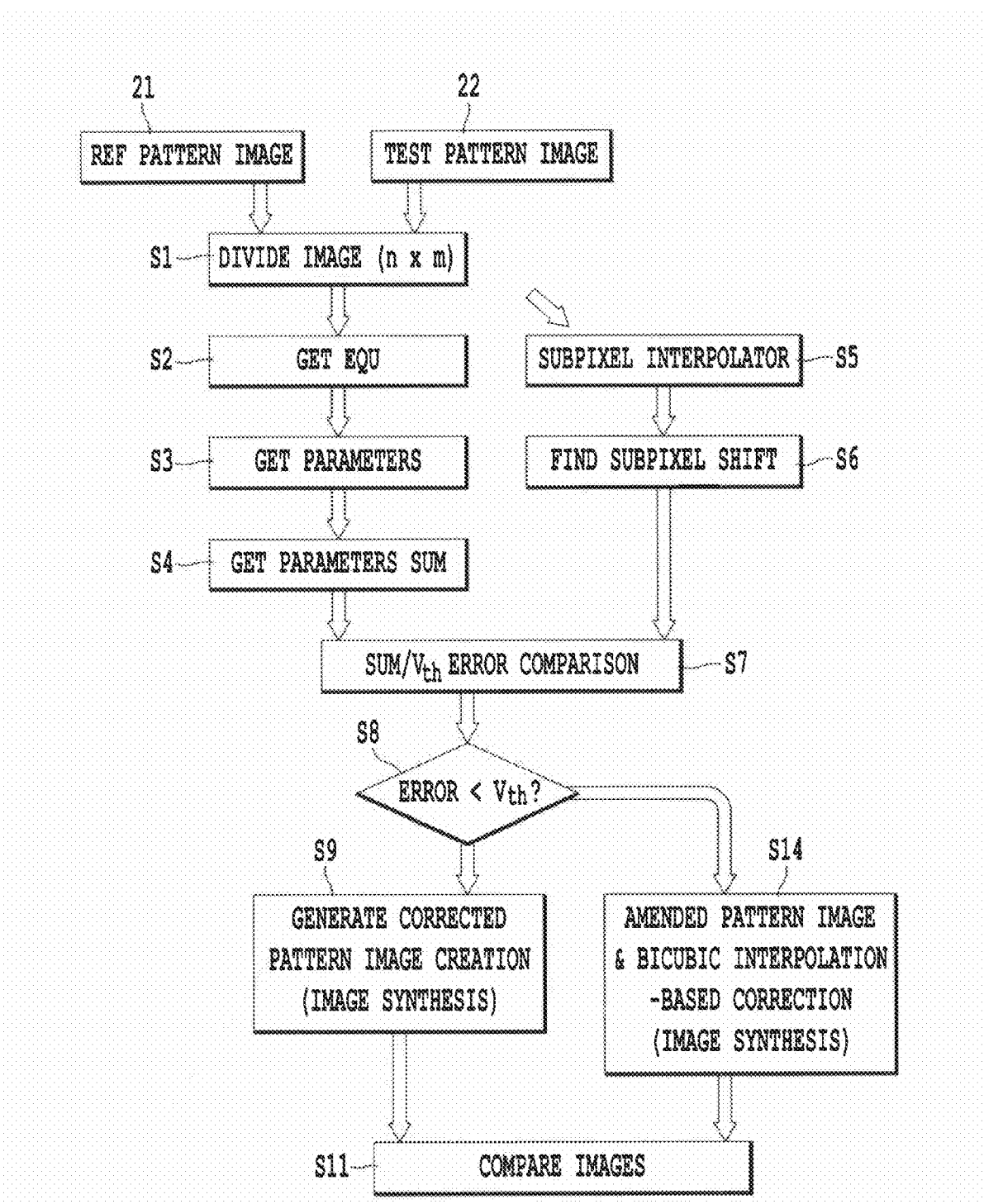
FIG. 14 is a flowchart showing a method for automatically switching between a 2D linear predictive modeling-based correction and a bicubic interpolation in accordance with another embodiment of the invention.

An explanation will be given of a third exemplary method for automatically switching between the 2D linear predictive modeling correction and bicubic interpolation-based correction. This method is designed to synthesize, by use of partial cutout and replacement, a corrected pattern image by means of the image subdivision and 2D linear predictive modeling and an interpolation-corrected image based on the bicubic interpolation. Suppose that the image of interest is divided into 4×4 regions as shown in FIG. 13A. Imagine that these regions include a region with its parameter sum being diverged from the value "1.0." In this case, let it be replaced by and combined together with a corresponding cutout or "cropped" part of the interpolation-corrected image as obtained by the bicubic interpolation-based correction in a way as indicated by dotted line linking between FIGS. 13A-13B. A procedure of such crop-and-paste process is shown in FIG. 14. This procedure is generally similar to that of FIG. 6 with the step S10 of the latter being replaced with step S14, which performs image synthesis in the way shown in FIGS. 13A-13B.

Example 4 of Auto-Correction Switch Method

A fourth exemplary method for automatically switching between the 2D linear predictive modeling correction and the bicubic interpolation-based correction is similar in procedure to the example 3 with step S14 of FIG. 14 being modified in a way which follows. A partially cropped image in this example is not the image obtained by the bicubic interpolation-based correction but a 2D linear predictive modeling-based corrected pattern image with an optimized division number, which is obtainable by the method of automatically switching between the 2D linear predictive modeling correction and the bicubic interpolation-based correction. More specifically, crop an appropriate corresponding part from the 2D linear predictive modeling-based corrected pattern image, and then combine it together with the target image.

As apparent from the foregoing description, in accordance with this invention, it is possible to effectively perform image correction and pattern inspection while offering automated adaptability to variations in density of workpiece pattern images being tested. Additionally it is readily occur to those skilled in the art that this invention should not exclusively be limited to the illustrative embodiments stated supra.

What is claimed is:

1. A method for correcting a pattern image by use of an inspection reference pattern image of a workpiece being tested and a pattern image under test, comprising:

dividing each of the reference pattern image and the under-test pattern image into a plurality of regions;

generating by linear predictive modeling a set of simultaneous equations for the reference pattern image thus divided and the divided test pattern image divided;

solving the equations to obtain model parameters for the plurality of regions; obtaining a model parameter sum for each said region;

applying interpolation processing to the reference pattern image and the test pattern image in units of sub-pixels to thereby generate a sub-pixel interpolated image;

using the sub-pixel interpolated image to obtain a sub-pixel shift amount for minimization of a deviation error in position between the reference pattern image and the test pattern image;

comparing each model parameter sum to a threshold to find an error therebetween, if any;

when every model parameter sum is within the threshold, combining together corrected pattern images as generated by the linear predictive modeling to thereby generate a single corrected pattern image;

when at least one model parameter sum is out of the threshold, redoing said dividing by use of a reduced number of division of the reference pattern image and the test pattern image; and when said dividing is failed and the model parameter sum is out of the threshold, generating an interpolated corrected image based on interpolation processing.

2. A method for correcting a pattern image by use of an inspection reference pattern image of a workpiece being tested and a pattern image under test, comprising:

dividing each of the reference pattern image and the under-test pattern image into a plurality of regions;

generating by linear predictive modeling a set of simultaneous equations for the reference pattern image thus divided and the divided test pattern image divided;

solving the equations to obtain model parameters for the plurality of regions;

obtaining a model parameter sum with respect to each of said plurality of regions;

applying interpolation processing to the reference pattern image and the test pattern image in units of sub-pixels to thereby generate a sub-pixel interpolated image;

using the sub-pixel interpolated image to obtain a sub-pixel shift amount for minimization of a deviation error in position between the reference pattern image and the test pattern image;

comparing each model parameter sum to a threshold to find an error therebetween, if any;

when at least one model parameter sum is out of the threshold, generating an interpolated corrected image based on interpolation processing; and performing image synthesis by cutting a region with its model parameter sum being out of the threshold and then pasting an interpolated corrected image corresponding such region to thereby generate a corrected pattern image.

3. A method for correcting a pattern image by use of an inspection reference pattern image of a workpiece being tested and a pattern image under test, comprising:

dividing each of the reference pattern image and the under-test pattern image into a plurality of regions;

generating by linear predictive modeling a set of simultaneous equations for the reference pattern image thus divided and the divided test pattern image divided;

solving the equations to obtain model parameters for the plurality of regions;

obtaining model parameter sums with respect to said plurality of regions;

applying interpolation processing to the reference pattern image and the test pattern image in units of sub-pixels to thereby generate a sub-pixel interpolated image;

using the sub-pixel interpolated image to obtain a sub-pixel shift amount for minimization of a deviation error in position between the reference pattern image and the test pattern image;

comparing each model parameter sum to a threshold to find an error therebetween, if any; and when at least one model parameter sum is out of the threshold, performing image synthesis by cutting a corrected pattern image region thereof and then pasting in the cut region a corrected pattern image with a finally obtained difference being within the threshold to thereby generate a corrected pattern image.

* * * * *